(12) United States Patent
Ding et al.

(10) Patent No.: US 9,013,238 B2
(45) Date of Patent: Apr. 21, 2015

(54) RADIO FREQUENCY POWER AMPLIFIER AND ELECTRONIC SYSTEM

(71) Applicant: Advanced Semiconductor Engineering Inc., Kaohsiung (TW)

(72) Inventors: Jaw-Ming Ding, Taoyuan County (TW); Jia-Hong Mou, Keelung (TW); Hsin-Chin Chang, Taipei (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 70 days.

(21) Appl. No.: 14/016,437

(22) Filed: Sep. 3, 2013

(65) Prior Publication Data

US 2014/0368277 A1 Dec. 18, 2014

(30) Foreign Application Priority Data

Jun. 13, 2013 (TW) .............................. 102120882 A

(51) Int. Cl.
*H03F 3/04* (2006.01)
*H03F 1/02* (2006.01)
*H03F 3/19* (2006.01)

(52) U.S. Cl.
CPC ................ *H03F 1/0205* (2013.01); *H03F 3/19* (2013.01)

(58) Field of Classification Search
USPC ............... 330/289, 285, 296, 298, 207 P, 302
See application file for complete search history.

(56) References Cited

U.S. PATENT DOCUMENTS

| | | | |
|---|---|---|---|
| 7,573,336 B2* | 8/2009 | Ishimaru et al. .............. | 330/296 |
| 8,183,928 B2* | 5/2012 | Kim et al. ..................... | 330/289 |
| 8,188,794 B2* | 5/2012 | Lautzenhiser ................ | 330/285 |
| 8,692,619 B2* | 4/2014 | Wakita et al. ................. | 330/296 |
| 2014/0167861 A1* | 6/2014 | Song ............................. | 330/296 |
| 2014/0240049 A1* | 8/2014 | Won et al. ..................... | 330/296 |

* cited by examiner

*Primary Examiner* — Henry Choe
(74) *Attorney, Agent, or Firm* — Foley & Lardner LLP; Cliff Z. Liu; Angela D. Murch

(57) ABSTRACT

A radio frequency (RF) amplifier is disclosed. The RF power amplifier includes a bias circuit, an output-stage circuit and a RF compensation circuit. When a first system voltage is larger than a first voltage threshold value, the bias circuit generates a first current rising slightly. When first system voltage is larger than second voltage threshold value, the RF compensation circuit receives a second circuit rising slightly transmitted from the bias circuit. When the first system voltage is in an operation voltage range, the first current is larger than the second circuit so as to a quiescent operating current of the RF power amplifier is independent of change of the first system voltage. When the first system voltage is larger than a third voltage threshold value, the first current is equal to the second current so as to have the bias current being a zero current to protect the RF power amplifier from over-voltage.

10 Claims, 8 Drawing Sheets

RADIO FREQUENCY POWER AMPLIFIER AND ELECTRONIC SYSTEM

BACKGROUND OF THE INVENTION

1. Field of the Invention

The instant disclosure relates to a RF power amplifier; in particular, to the RF power amplifier with a quiescent operating current which is stable.

2. Description of Related Art

With the advancement of the internet, people are accustomed to receive information quickly and heavily, especially advancement of wireless communication technology. After personal mobile products, such as mobile phone, personal digital assistant and other products, are popular with an amazing speed, people want to be able to obtain real-time information, but also want to have instant online-support. Therefore, wireless local area network (WLAN) combining internet and wireless communication and third-generation (3G)/fourth generation (4G) network are solutions to meet the demands of people.

Among hand-held wireless communication products, main direct current (DC) power consumption comes from a RF power amplifier. Therefore, to keep a high linearity of the RF power amplifier instead of distorting an amplified signal, and to maintain a high efficiency to support a long time of communication has always been a focus in designing the RF power amplifier. In particular, there is an obvious characteristic of a time-varying wave packet when a broadly used digital modulation technique of orthogonal frequency-division multiplexing (OFDM) is adopted in a wireless communication system, and a constant of peak to average power ratio (PAPR) of which is way higher than that of the current wireless communication system; in other words, the variation of the wave packet with time is more dramatic, and thus a demand of the linearity of the RF power amplifier is higher.

However, in prior art, the RF power amplifier provided by U.S. Patent Publication No. US2003/6556082 does not be affected by ambient temperature, but a quiescent operating current outputted from the RF power amplifier may be affected in the face of the battery voltage. To third-generation (3G)/fourth generation (4G) mobile phone system, for example, 3G/4G mobile phone system has great demand for accuracy of RF output power. Because voltage value of the phone battery may change between 3.2 volt and 4.2 volt, accuracy of RF output power of the RF power amplifier may be affected.

SUMMARY OF THE INVENTION

The instant disclosure provides a RF power amplifier used for receiving and amplifying a RF input signal and outputting a RF output signal. The RF power amplifier comprises a bias circuit, an output-stage circuit and a RF compensation circuit. The bias circuit is electrically connected to a first system voltage and the bias circuit provides a bias current, wherein when the first system voltage is larger than a first voltage threshold value, the bias circuit receives a first current rising slightly. The output-stage circuit is electrically connected to a second system voltage and the bias circuit and the output-stage circuit receives the bias current for working at an operation bias point. The RF compensation circuit is electrically connected to the bias circuit. When first system voltage is larger than a second voltage threshold value, the RF compensation circuit receives a second current rising slightly which is transmitted from the bias circuit. The second voltage threshold value is larger than the first voltage threshold value and when the first system voltage works in an operation voltage interval, current value of the first current is larger than current value of the second current and slope of rising slightly is identical to each other substantially, so that a quiescent operating current of the RF power amplifier is independent of change of the first system voltage. When the first system voltage is larger than a third voltage threshold value, current value of the first current is equal to current value of the second current, so that the bias current is zero current for over-voltage protecting RF power amplifier, wherein the third voltage threshold value is larger than the second voltage threshold value. When the first system voltage works in the operation voltage interval, current values of the first current and the second current increase with increasing of the ambient temperature, and rising magnitude is identical to each other substantially, so that the quiescent operating current is a current equal to or close to zero temperature coefficient.

In an embodiment of the instant disclosure, first voltage threshold value is between 2.3 volt and 2.5 volt, the second voltage threshold value is between 2.9 volt and 3 volt, the third voltage threshold value is between 5.8 volt and 6 volt, and the operation voltage interval is between 3.2 volt and 4.2 volt.

In an embodiment of the instant disclosure, the RF power amplifier further comprises an input match circuit and an output match circuit. The input match circuit is electrically connected to the output-stage circuit and the input match circuit receives the RF input signal and then provides performance of matching input power to the output-stage circuit. The output match circuit is electrically connected to the output-stage circuit and the output match circuit outputs the RF output signal and then provides performance of matching output power to the output-stage circuit.

In an embodiment of the instant disclosure, the bias circuit further comprises a first resistor, a first transistor, a second transistor, a second resistor and a third resistor. One terminal of the first resistor is connected to the first system voltage. A base of the first transistor is connected to another terminal of the first resistor, and a collector of the first transistor is connected to the first system voltage. A collector of the second transistor is connected to the base of the first transistor and an emitter of the second transistor is connected to a ground voltage. One terminal of the second resistor is connected to an emitter of the first transistor and another terminal of the second resistor is connected to the base of the second transistor. One terminal of the third resistor is connected to the emitter of the first transistor.

In an embodiment of the instant disclosure, the output-stage circuit comprises an output transistor and a collector resistor. A base of the output transistor is connected to another terminal of the third resistor and an emitter of the output transistor is connected to the ground voltage. One terminal of the collector resistor is connected to the second system voltage and another terminal of the collector resistor is connected to collector of the output transistor. The output transistor receives and amplifies the RF input signal via the input match circuit and outputs the RF output signal via the output match circuit. When emitter area of the output transistor is N times of emitter area of the second transistor and resistor value of the second resistor is N times of resistor value of the third resistor, the quiescent operating current of the output transistor is N times of the third current, wherein N is rational number larger than 1.

In an embodiment of the instant disclosure, the RF compensation circuit comprises a fourth resistor, a fifth resistor, a sixth resistor, a third transistor, a fourth transistor, a seventh resistor, a fifth transistor, a sixth transistor and an eighth resistor. One terminal of the fourth resistor is connected to the ground voltage. One terminal of the fifth resistor is connected to the ground voltage. One terminal of the sixth resistor is connected to the ground voltage. An emitter of the third transistor is connected to another terminal of the fourth resistor and a base of the third transistor is connected to another terminal of the fifth resistor. An emitter of the fourth transistor is connected to another terminal of the sixth resistor and a base of the fourth transistor is connected to the base of the third transistor. One terminal of the seventh resistor is connected to another terminal of the fifth resistor, wherein resistor value of the fifth resistor is three times of resistor value of the seventh resistor and resistor value of the fourth resistor and the sixth resistor is far less than resistor value of the seventh resistor. An emitter of the fifth transistor is connected to a collector of the fourth transistor and a collector of the fifth transistor is connected to another terminal of the first resistor for receiving the second current. An emitter of the sixth transistor is connected to another terminal of the seventh resistor, a base of the sixth transistor is connected to a base of the fifth transistor and a collector of the third transistor, and a collector of the sixth transistor is connected to the first system voltage. One terminal of the eighth resistor is connected to the collector of the third transistor and another terminal of the eighth resistor is connected to the first system voltage. Through adjusting ratio of resistor value between the eighth resistor and the first resistor, so that the quiescent operating current is a current equal to or close to zero temperature coefficient.

In an embodiment of the instant disclosure, when first system voltage is larger than third voltage threshold value, the fifth transistor and the sixth transistor significantly draw all of the first current to be served as the second current, so that the bias current is zero current.

In an embodiment of the instant disclosure, when resistor value of the eighth resistor is three times of resistor value of the first resistor, the resistor value of the fifth resistor is three times of resistor value of the seventh resistor, and the first system voltage works in the operation voltage interval, current value of the first current is larger than current value of the second current and slope of rising slightly is identical to each other, so that the quiescent operating current is independent of change of the first system voltage.

In an embodiment of the instant disclosure, the first transistor, the second transistor, the third transistor, the fourth transistor, the fifth transistor. the sixth transistor and the output transistor are hetero-junction bipolar transistors (HBT).

The instant disclosure provides an electronic system. The electronic system comprises a RF power amplifier and a load. The RF power amplifier receiving a RF input signal and outputting a RF output signal. The load is electrically connected to the RF power amplifier and receives the RF output signal.

In summary, the RF power amplifier and the electronic system of the instant disclosure is able to provide excellent effect of the temperature compensation, so that an output power and the quiescent operating current of the RF power amplifier still maintain stable relative to temperature change and the quiescent operating current of the RF power amplifier is independent of change of a battery voltage and then maintain high-linearity of an communication system without distorting RF output signal. Additionally, the RF power amplifier of the instant disclosure is further able to achieve performance of over-voltage protecting, so as to avoid damage of the electronic system from over-high battery voltage.

For further understanding of the instant disclosure, reference is made to the following detailed description illustrating the embodiments and examples of the instant disclosure. The description is only for illustrating the instant disclosure, not for limiting the scope of the claim.

DETAILED DESCRIPTION OF PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

It will be understood that, although the terms first, second, third, and the like, may be used herein to describe various elements, components, regions, layers and/or sections, these elements, components, regions, layers and/or sections should not be limited by these terms. These terms are only to distinguish one element, component, region, layer or section from another region, layer or section discussed below could be termed a second element, component, region, layer or section without departing from the teachings of the present disclosure. As used herein, the term "and/or" includes any and all combinations of one or more of the associated listed items.

[Embodiment of the RF Power Amplifier]

Among hand-held wireless communication products, main direct current (DC) power consumption comes from a RF power amplifier. Therefore, to keep a high linearity of the RF power amplifier instead of distorting an amplified signal, and to maintain a high efficiency to support a long time of communication has always been a focus in designing the RF power amplifier.

Figure 1:
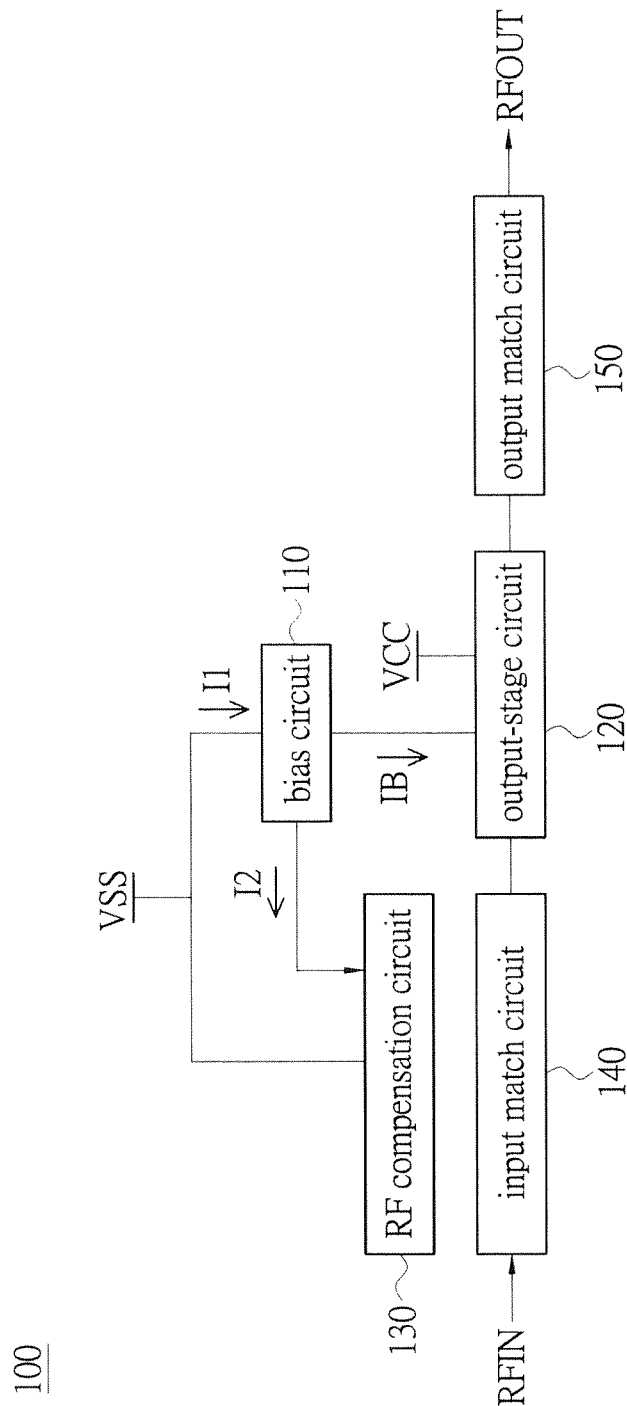
FIG. 1 shows block schematic diagram of the RF power amplifier according to one embodiment of the instant disclosure.

Referring to FIG. 1, FIG. 1 shows block schematic diagram of the RF power amplifier according to one embodiment of the instant disclosure. As shown in FIG. 1, the RF power amplifier comprises a bias circuit 110, a output-stage circuit 120, RF compensation circuit 130, an input match circuit 140 and an output match circuit 150. The bias circuit 110 is electrically connected to output-stage circuit 120 and is electrically connected to first system voltage VSS (i.e. a battery voltage). The output-stage circuit 120 is electrically connected between the input match circuit 140 and the output match circuit 150, and the output-stage circuit 120 is electrically connected to a second system voltage VCC. The RF compensation circuit 130 is electrically connected to the bias circuit 110. It should be understood that the input match circuit 140 is configured for receiving an RF input signal RFIN so as to provide performance of matching input power to the output-stage circuit 120. The output match circuit 150 is configured for outputting a RF output signal RFOUT so as to provide performance of matching output power to the output-stage circuit 120.

Regarding the bias circuit 110, the bias circuit 110 is configured for providing the bias current IB to the output-stage circuit 120. When an electronic system comprising the RF power amplifier 100 starts-up, the first system voltage VSS may increase slowly and then when voltage value of the first system voltage VSS starts to be larger than a first voltage threshold value (between 2.3 volt and 2.5 volt), the bias circuit 110 may start to enter into a normal operation state and receive a first current I1 which is flowing from one terminal of the first system voltage VSS to the bias circuit 110. With rising of voltage value of the first system voltage VSS, the first current I1 also increased slightly; which means, a positive proportional relationship exists between the first system voltage VSS and the first current I1. Regarding to output-stage circuit 120, the second system voltage VCC received by the output-stage circuit 120 is typically a fixed voltage provided by a DC-DC converter or general purpose input/output (GPIO) of a transceiver IC. Moreover, the output-stage circuit 120 is configured for receiving the bias current IB so as to works at an operation bias point. Regarding to the RF compensation circuit 130, when voltage value of the first system voltage VSS is larger than a second voltage threshold value (between 2.9 volt and 3 volt), the RF compensation circuit 130 starts to operate and receives the second current I2 transmitted by the bias circuit 110, wherein the second current I2 rises as the first system voltage VSS rises and it shows a trend of rising slightly. It is worth mentioned that when the first system voltage VSS works in an operation voltage interval (i.e. between 3.2 volt and 4.2 volt), current value of the first current I1 is larger than current value of the second current I2 and slope of rising slightly is identical to each other substantially, so that an quiescent operating current of the RF power amplifier 100 is independent of change of the first system voltage VSS.

In the aspect of the over-voltage protection, the RF power amplifier 100 of the instant disclosure, when voltage value of the first system voltage VSS is larger than the third voltage threshold value (between 5.8 volt and 6 volt), current value of the first current I1 is equal to current value of the second current I2 so that the bias current IB is zero current for turning-off the output-stage circuit 120 to achieve effect of over-voltage protection for the RF power amplifier 100, wherein the third voltage threshold value is larger than the second voltage threshold value.

Additionally, in the aspect of the temperature compensation effect, when the first system voltage VSS works in the operation voltage interval, current value of the first current I1 and the second current I2 rises with increasing of the ambient temperature and rising magnitude of the first current I1 and the second current I2 are identical to each other, so that the quiescent operating current (i.e. the output current of the output-stage circuit 120) is equal to or close to a current with zero temperature coefficient. In other words, the quiescent operating current does not change with change of ambient temperature. In short, the RF compensation circuit 130 of the instant disclosure is able to make the RF power amplifier 100 be independent of change of the ambient temperature and the battery voltage (i.e. the first system voltage VSS), and when the battery voltage is over high, the RF compensation circuit 130 may draw all of the first current I1 (i.e. current value of the second current I2 is equal to current value of the first current I1) so as to turn-off the output-stage circuit 120, and then protects the RF power amplifier 100. Accordingly, the RF compensation circuit 130 is able to make the RF power amplifier 100 be with high linearity without distorting amplified signal, and also have high efficiency in order to extend the communication time.

it is to be clarified that in the instant disclosure, the positive temperature coefficient indicates that there is a proportional relationship between physical quantities (such as a voltage value, a current value, and a resistor value) and the temperature; which means, when the temperature increases or decreases, the physical quantities increases or decreases with the temperature; the negative temperature coefficient indicates that there is an inverse relationship between the physical quantities and the temperature; which means, when the temperature increases or decreases, the physical quantities decreases or increases with the temperature. The zero temperature coefficient in the instant disclosure indicates that the relationship between the physical quantities (such as the voltage value, the current value, and the resistor value) and the temperature is irrelevant, which means, when the temperature increases or decreases, the physical quantities do not increase or decrease with the temperature.

To present more operation details of the RF power amplifier 100 of the instant disclosure, there are at least one embodiment for further instruction as the below.

In the following embodiments, there are only parts different from the embodiment in the FIG. 1 described, and the omitted parts are indicated to be the same to the embodiment in the FIG. 1. In addition, to instruct easily, similar referred numbers or symbols are indicated to be elements alike.

[Another Embodiment of the RF Power Amplifier]

Figure 2:
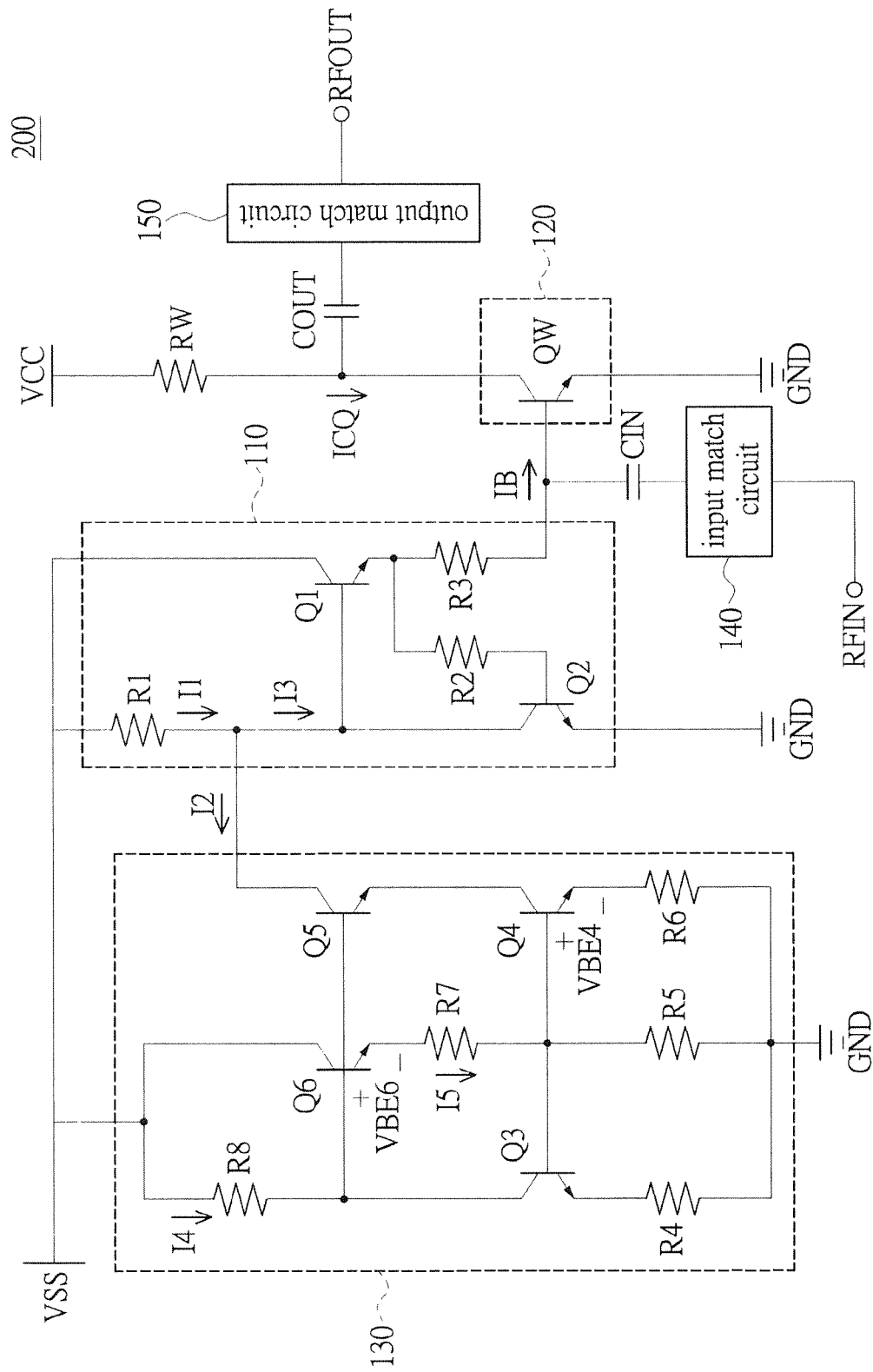
FIG. 2 shows detailed schematic diagram of the RF power amplifier according to one embodiment of the instant disclosure.

Referring to FIG. 2, FIG. 2 shows detailed schematic diagram of the RF power amplifier according to one embodiment of the instant disclosure. Difference from above-mentioned embodiment in FIG. 1 is that, in the embodiment of the RF power amplifier 200 in FIG. 2, the bias circuit 110 comprises a first resistor R1, a first transistor Q1, a second transistor Q2, a second resistor R2 and a third resistor R3. The output-stage circuit 120 comprises an output transistor QW. The RF compensation circuit 130 comprises a fourth resistor R4, a fifth resistor R5, a sixth resistor R6, a seventh resistor R7, an eighth resistor R8, a third transistor Q3, a fourth transistor Q4, a fifth transistor Q5 and a sixth transistor Q6. One terminal of the first resistor R1 is connected to the first system voltage VSS. Base of the first transistor Q1 is connected to another terminal of the first resistor R1, collector of the first transistor Q1 is connected to first system voltage VSS. Collector of the second transistor Q2 is connected to base of the first transistor Q1, and emitter of the second transistor Q2 is connected to the ground voltage GND. One terminal of the second resistor R2 is connected to emitter of the first transistor Q1, and another terminal of the second resistor R2 is connected to base of the second transistor Q2. One terminal of the third resistor R3 is connected to emitter of the first transistor Q1. Base of the output transistor QW is connected to another terminal of the third resistor R3, and emitter of the output transistor QW is connected to the ground voltage GND. The RF power amplifier 200 in the present embodiment further comprises a collector resistor RW, wherein one terminal of the collector resistor RW is connected to the second system voltage VCC and another terminal of the collector resistor RW is connected to collector of the output transistor QW. The output transistor QW receives and amplifies the RF input signal RFIN via the input match circuit 140, and outputs the RF output signal RFOUT via the output match circuit 150. When emitter area of the output transistor QW is N times of emitter area of the second transistor Q2 and resistor value of the second resistor R2 is N times of resistor value of the third resistor R3, the quiescent operating current ICQ of the output transistor QW is N times of the third current I3, wherein N is a rational number larger than 1. In the present embodiment, the first transistor Q1, the second transistor Q2, the third transistor Q3, the fourth transistor Q4, the fifth transistor Q5, the sixth transistor Q6 and the output transistor QW are hetero-junction bipolar transistors (HBT), so the RF power amplifier 200 may not need the process of other types of transistors (such as pHEMT), and thus it is able to save manufacturing costs of the RF front-end circuit in the communication system.

One terminal of the fourth resistor R4 is connected to the ground voltage GND. One terminal of the fifth resistor R5 is connected to the ground voltage GND. One terminal of the sixth resistor R6 is connected to the ground voltage GND. Emitter of the third transistor Q3 is connected to another terminal of the fourth resistor R4, and base of the third transistor Q3 is connected to another terminal of the fifth resistor R5. Emitter of the fourth transistor Q4 is connected to another terminal of the sixth resistor R6, and base of the fourth transistor Q4 is connected to base of the third transistor Q3. One terminal of the seventh resistor R7 is connected to another terminal of the fifth resistor R5. It is worth mentioned that a resistor value of the fifth resistor R5 is three times of a resistor value of the seventh resistor R7, wherein the resistor value is determined by design. Moreover, resistor value of the fourth resistor R4 and the sixth resistor R6 is far less than resistor value of the seventh resistor R7. Emitter of the fifth transistor Q5 is connected to collector of the fourth transistor Q4, and collector of the fifth transistor Q5 is connected to another terminal of the first resistor R1 for receiving the second current I2. Emitter of the sixth transistor Q6 is connected to another terminal of the seventh resistor R7, base of the sixth transistor Q6 is connected to base of the fifth transistor Q5 and collector of the third transistor Q3, and collector of the sixth transistor Q6 is connected to the first system voltage VSS. One terminal of the eighth resistor R8 is connected to collector of the third transistor Q3, and another terminal of the eighth resistor R8 is connected to the first system voltage VSS. Through adjusting ratio of resistor value between the eighth resistor R8 and the first resistor R1, the quiescent operating current ICQ may be equal to or close to a current with zero temperature coefficient.

The following description is further instruction in teaching a work mechanism of the RF power amplifier 200. In the present embodiment, the following example is to assume that the first voltage threshold value is 2.4 volt, the second voltage threshold value is 2.9 volt and the third voltage threshold value is 6 volt.

When an electronic system comprising the RF power amplifier 200 starts-up, the first system voltage VSS may increase slowly and then enters into an operation voltage interval (between 3.2 volt and 4.2 volt). When voltage value of the first system voltage VSS (i.e. a battery voltage) starts to be larger than a first voltage threshold value (e.g. 2.4 volt), the first current I1 may be generated and flow through the first resistor R1. However, the battery voltage with 2.4 volt is still not sufficient to start the entire RF compensation circuit 130, the third current I3 is totally equal to the first current I1. When the first system voltage VSS rises continuously and is larger than the second voltage threshold value (e.g. 2.9 volt, it is sufficient to start-up the transistors Q3 and Q4), the RF compensation circuit 130 starts to draw partial current of the first current I1; which means, it draws current via the fifth transistor Q5, the fourth transistor Q4 and the sixth resistor R6. Furthermore, in the aspect of the temperature compensation effect, designer can make assumption as follows in reason, the first current as shown in equation (1), wherein the symbol VBE represents base-emitter voltage of the first transistor Q1 and the second transistor Q2 and both of base-emitter voltage are identical to each other, and the equation (1) is already ignored voltage-drop of the second resistor R2. Moreover, base current of the third transistor Q3 and the fourth transistor Q4 is ignored in reason, and effect of the sixth resistor R6 is ignored, so that the fifth current I5 can be deduced, as shown in equation (2). Accordingly, emitter voltage of the sixth transistor Q6 is current value of the fifth current I5 multiplied by resistor value of the fifth resistor R5 and the seventh resistor R7, so that the fourth current I4 flowing through the eighth resistor R8 can be deduced, as shown in equation (3), wherein symbols VBE4 and VBE6 respectively represents base-emitter voltage of the fourth transistor Q4 and the sixth transistor Q6. In the present embodiment, designer can further design that resistor value of the fourth resistor R4 is three times of resistor value of the sixth resistor R6, as shown in equation (4), so current value of the second current I2 is K times of current value of the fourth current I4 (since the relationship of the current mirror mapping) and the fourth current I4 can be viewed as a mapping of the second current I2. Next, the third current I3 is equal to a value that the second current I2 is subtracted by the first current I1, as shown in equation (5). The quiescent operating current ICQ is a current mapped and amplified from the third current I3 by current mirror; which means, when emitter area of the output transistor QW is N times of emitter area of the second transistor Q2 and resistor value of the second resistor R2 is N times of resistor value of the third resistor R3, the quiescent operating current ICQ of the output transistor QW is N times of the third current I3, wherein N is a rational number larger than 1. Therefore, After differential operation of the quiescent operating current ICQ relative to temperature variable, it should be understood that the quiescent operating current ICQ outputted from the RF power amplifier 200 working in the operation voltage interval (e.g. between 3.2 volt and 4.2 volt) may be equal to or close to a current with zero temperature coefficient via adjusting ratio of resistor value between the eighth resistor R8 and the first resistor R1 and designing transistor size suitably. The RF power amplifier 200 of the instant disclosure shows excellent temperature compensation effect so as to be independent of change of ambient temperature. It is to be noted that, in the present embodiment, resistor value of the fifth resistor R5 is three times of the resistor value of the seventh resistor R7, resistor value of the fourth resistor R4 is three times of the resistor value of the sixth resistor R6, and resistor value of the fifth resistor R5 and the seventh resistor R7 is far larger than resistor value of the sixth resistor R6 and the fourth resistor R4.

$$I1 = (VSS - 2VBE)/R1 \quad (1)$$

$$I5 = VBE4/R5 \quad (2)$$

$$I4 = (VSS - (VBE4 \times ((R7 + R5)/R5)) - VBE6)/R8 \quad (3)$$

$$R4 = 3 \times R6 \quad (4)$$

$$\begin{aligned} I3 &= I1 - I2 = I1 - k \times I4 \\ &= ((VSS - 2VBE)/R1) - k \times \\ &\quad (VSS - (VBE4 \times ((R7 + R5)/R5)) - VBE6)/R8 \end{aligned} \quad (5)$$

Additionally, if the third current I3 is proceed differential operation relative to the first system voltage VSS, it should be understood that when resistor value of the eighth resistor R8 is three times of resistor value of the first resistor R and the first system voltage VSS works in the operation voltage interval, the current value of the first current I1 is larger than current value of the second current I2, and slope of two currents rising slightly are identical to each other. Therefore, quiescent operating current ICQ outputted from the RF power amplifier 200 may not only change with change of ambient temperature, but also be independent of change of the first system voltage VSS, so that the RF power amplifier 200 shows excellent stability and high linearity.

Moreover, the RF power amplifier 200 of the instant disclosure is able to achieve over-voltage protection via the RF compensation circuit 130; which means, when the battery voltage rise continuously because of unknown abnormal factor and is larger than the third voltage threshold value (e.g. 6 volt), the RF power amplifier 200 may significantly draw all of the first current I1 so as to be served as the second current I2 via the fifth transistor Q5 and the sixth transistor Q6 of the RF compensation circuit 130, so that the third current I3 is zero current. Because the third current I3 is zero current, the bias current IB and the quiescent operating current ICQ will also be zero current, and then this phenomenon is equivalent to turn off the output stage circuit 120 of the RF power amplifier 200.

Figure 3:
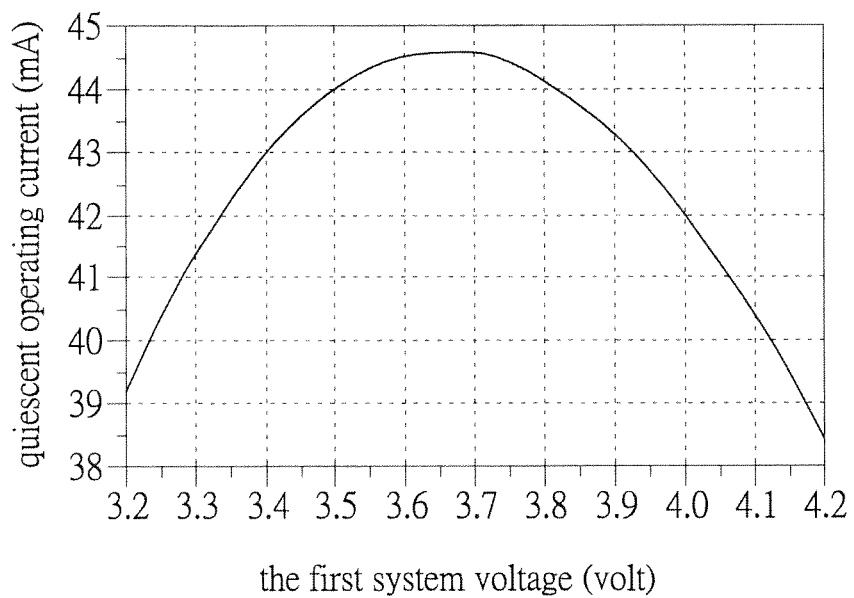
FIG. 3 shows simulation curve view of the quiescent operating current relative to first system voltage according to one embodiment of the instant disclosure.
Figure 4:
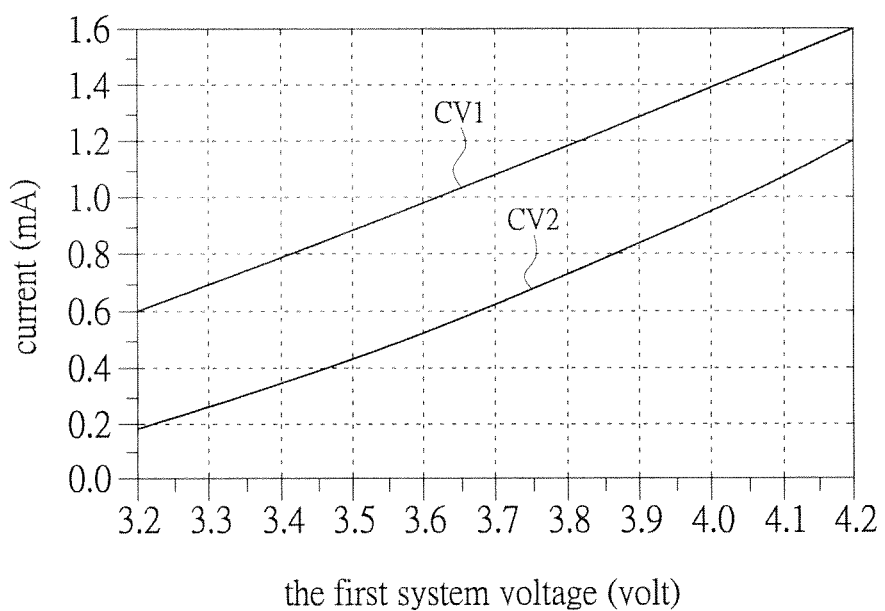
FIG. 4 shows simulation curve view of the first and second current relative to first system voltage according to one embodiment of the instant disclosure.
Figure 5:
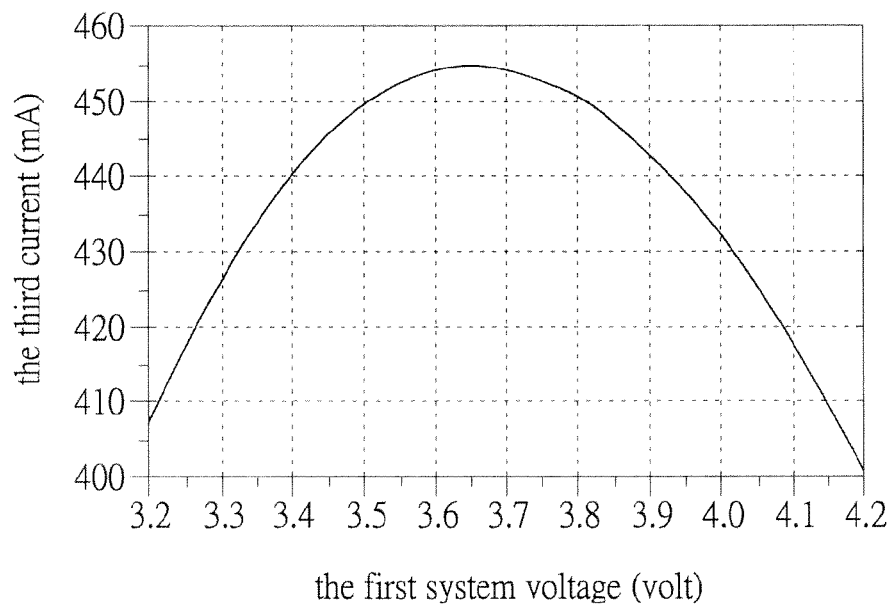
FIG. 5 shows simulation curve view of the third current relative to first system voltage according to one embodiment of the instant disclosure.

For further understanding effect of the instant disclosure, the following examples will further validate the RF power amplifier 200 in the FIG. 2 through the simulation curve diagram. Referring to FIGS. 2~5, FIG. 3 shows simulation curve view of the quiescent operating current relative to first system voltage according to one embodiment of the instant disclosure. FIG. 4 shows simulation curve view of the first and second current relative to first system voltage according to one embodiment of the instant disclosure. FIG. 5 shows simulation curve view of the third current relative to first system voltage according to one embodiment of the instant disclosure. As shown in FIG. 3, the horizontal axis represents the first system voltage (in volts), the vertical axis represents quiescent operating current (in units of mA). When the battery voltage changes between 3.2 volt and 4.2 volt, it should be understood that variation of the quiescent operating current ICQ is very small and the stability of the quiescent operating current ICQ relative to change of the battery voltage meets the demand of the communication system nowadays. In detail, as shown in FIG. 4, curve CV1 represents the first current I1, curve CV2 represents the second current I2, the horizontal axis represents the first system voltage (in volts), and the vertical axis represents current (in units of mA). When voltage value of the battery voltage changes between 3.2 volt and 4.2 volt, it should be understood that current value of the first current I1 and the second current I2 rise slightly with increasing of voltage value of the battery voltage, and slope of two current rising slightly are identical to each other. It is to be noted that the third current I3 is equal to that the second current I2 is subtracted by the first current I1, as shown in FIG. 5, the horizontal axis represents the first system voltage (in volts), and the vertical axis represents the third current (in units of mA). When voltage value of the battery voltage changes between 3.2 volt and 4.2 volt, variation of the third current I3 is equal to 50 mA or so and then this is viewed as stable current in the RF power amplifier 200.

Figure 6:
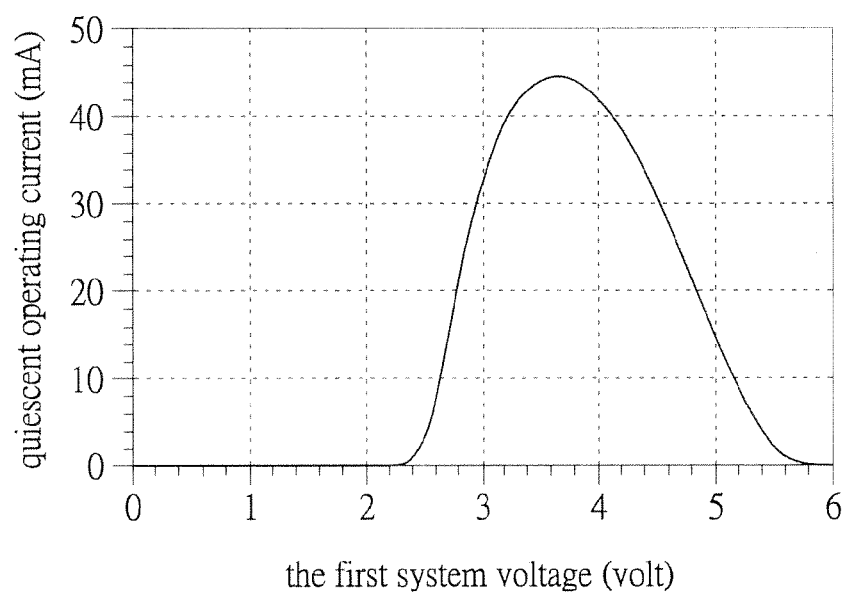
FIG. 6 shows simulation curve view of the quiescent operating current relative to first system voltage according to one embodiment of the instant disclosure.
Figure 7:
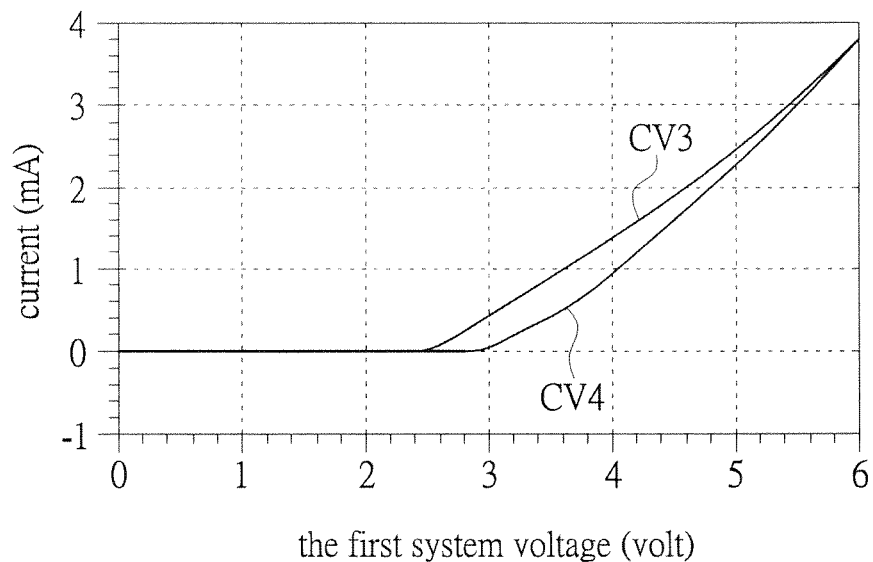
FIG. 7 shows simulation curve view of the first and second current relative to first system voltage according to another embodiment of the instant disclosure.
Figure 8:
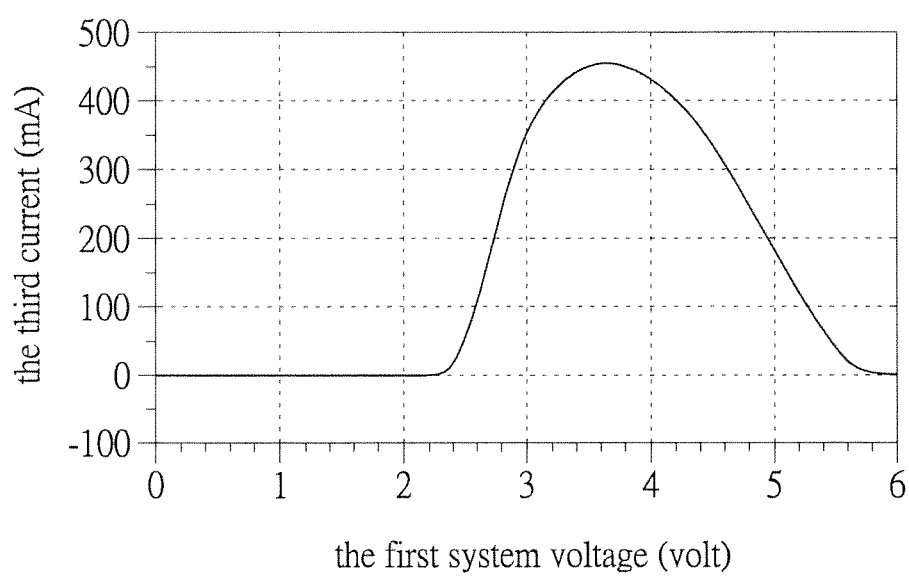
FIG. 8 shows simulation curve view of the third current relative to first system voltage according to one embodiment of the instant disclosure.

In the aspect of over-voltage protection, referring to FIGS. 6~8, FIG. 6 shows simulation curve view of the quiescent operating current relative to first system voltage according to one embodiment of the instant disclosure. FIG. 7 shows simulation curve view of the first and second current relative to first system voltage according to one embodiment of the instant disclosure. FIG. 8 shows simulation curve view of the third current relative to first system voltage according to one embodiment of the instant disclosure. In FIG. 7, curve CV3 represents the first current I1, curve CV4 represents the second current I2, when voltage value of the first system voltage VSS increases to the first voltage threshold value (e.g. 2.4 volt), the first current I1 starts to rise slightly and the second current I2 is generated at this time. Afterwards, when voltage value of the first system voltage VSS increases to the second voltage threshold value (e.g. 2.9 volt), the second current I2 starts to rise slightly. It is worth noticing that when voltage value of the battery voltage works between 3.2 volt and 4.2 volt, slopes of curve CV3 and CV4 rising slightly are identical to each other. Next, because configuration of the fifth transistor Q5 and the fourth transistor Q4 in the RF compensation circuit 130 is cascoded relationship, slope of the curve CV4 (i.e. curve of the second current I2) also increases slowly when voltage value of the battery voltage is larger than 4.2 volt. Therefore, when voltage value of the battery voltage increases to the third voltage threshold value (e.g. 5.8 volt), curve CV4 and CV3 starts to overlap, which means, current value of the second current I2 is equal to current value of the first current I1. In other words, the RF compensation circuit 130 may draw all of the first current I1 to make the first current I1 be served as the second current I2. Next, FIG. 8 shows that when voltage value of the battery voltage works at 5.8 volt about, the third current I3 shows a phenomenon of zero current, so that the bias current IB and the quiescent operating current ICQ will decrease to zero current, as shown in FIG. 6.

Figure 9:
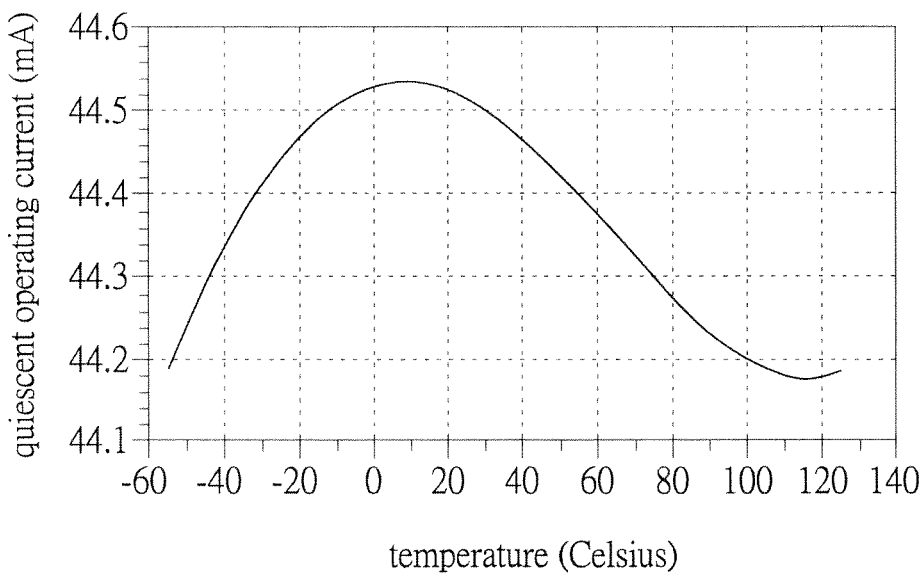
FIG. 9 shows simulation curve view of the quiescent operating current relative to temperature according to one embodiment of the instant disclosure.
Figure 10:
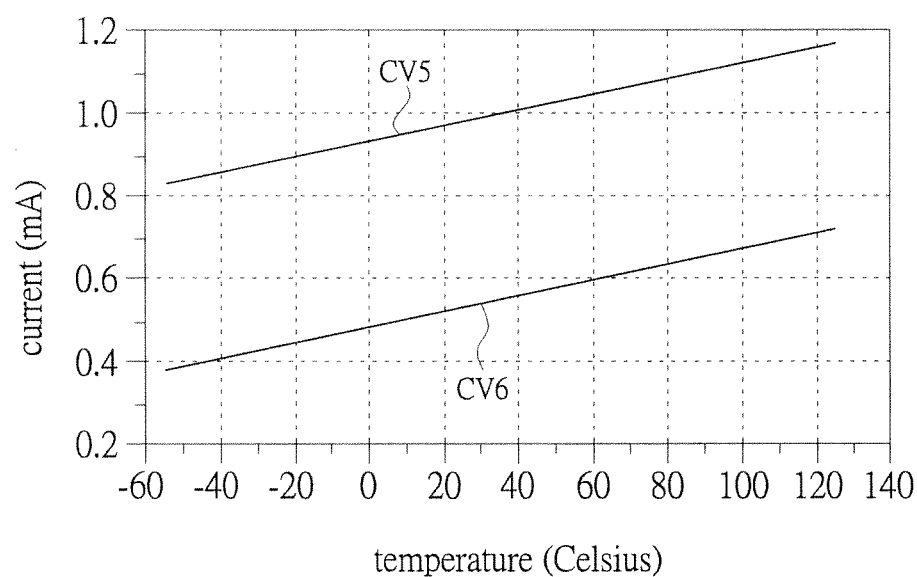
FIG. 10 shows simulation curve view of the first and second current relative to temperature according to one embodiment of the instant disclosure.
Figure 11:
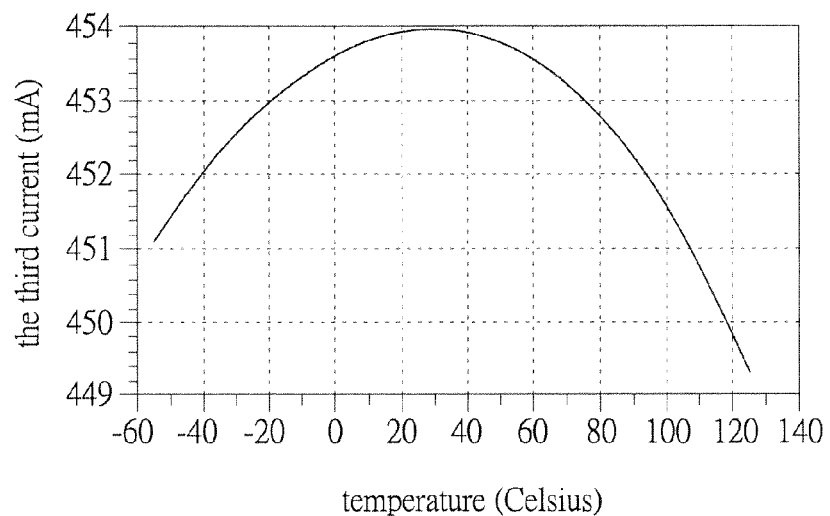
FIG. 11 shows simulation curve view of the third current relative to temperature according to one embodiment of the instant disclosure.
Figure 12:
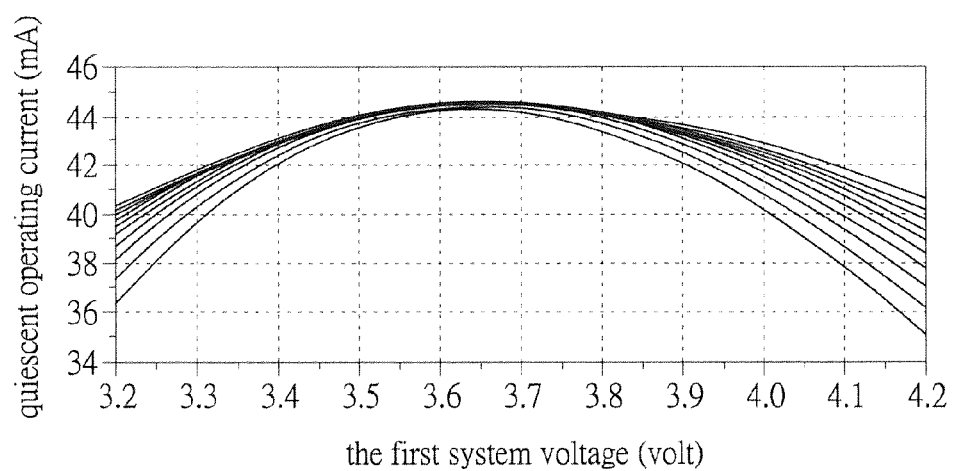
FIG. 12 shows simulation curve view of the quiescent operating current relative to the first system voltage under temperature scanning according to one embodiment of the instant disclosure.

In the aspect of temperature compensation effect, referring to FIGS. 9~12. FIG. 9 shows simulation curve view of the quiescent operating current relative to temperature according to one embodiment of the instant disclosure. FIG. 10 shows simulation curve view of the first and second current relative to temperature according to one embodiment of the instant disclosure. FIG. 11 shows simulation curve view of the third second current relative to temperature according to one embodiment of the instant disclosure. FIG. 12 shows simulation curve view of the quiescent operating current relative to the first system voltage under temperature scanning according to one embodiment of the instant disclosure. First, in FIG. 10, curve CV5 represents the first current I1 and curve CV6 represents the second current I2. Under simulation of temperature between minus 55 degrees Celsius and 125 degrees Celsius, the first current I1 and the second current I2 may rise slightly and slopes of two current rising slightly are identical to each other. Therefore, variation of the third current I3 (as shown in FIG. 11) is less than 5 mA when temperature is between minus 55 degrees Celsius and 125 degrees Celsius. As shown in FIG. 9, the quiescent operating current ICQ has very high stability when temperature changes. Next, under the consideration of change of the battery voltage and ambient temperature simultaneously, the first system voltage VSS is set between 3.2 volt and 4.2 volt and ambient temperature is set between minus 55 degrees Celsius and 125 degrees Celsius, as shown in FIG. 12, the quiescent operating current ICQ of the RF power amplifier 200 still shows high stability in face of change of the battery voltage and ambient temperature, so that the RF power amplifier 200 meets the demand of stability of the communication system.

[One Embodiment of the Electronic System]

Figure 13:
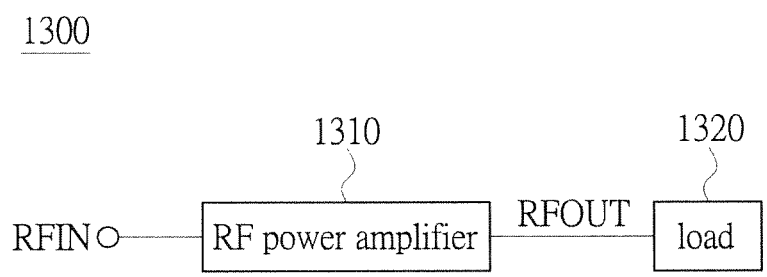
FIG. 13 shows a block schematic diagram of the electronic system according to embodiment of the instant disclosure.

Referring to FIG. 13, FIG. 13 shows a block schematic diagram of the electronic system according to embodiment of the instant disclosure. The electronic system 1300 comprises a RF power amplifier 1310 and a load 1320. The RF power amplifier 1310 receives an RF input signal RFIN and outputs RF output signal RFOUT to the load 1320; which means, when the RF power amplifier 1310 is coupled to a system voltage, the RF power amplifier 1310 may provide a stable power to the load 1320. The RF power amplifier 1310 may be one of the RF power amplifiers 100 and 200 in the former embodiments, providing a stable output power to the load 1320. The electronic system 1300 may be a system in various kinds of electronic devices such as hand-held devices or portable devices.

In summary, the RF power amplifier and the electronic system of the instant disclosure is able to provide excellent effect of the temperature compensation, so that an output power and the quiescent operating current of the RF power amplifier still maintain stable relative to temperature change and the quiescent operating current of the RF power amplifier is independent of change of a battery voltage and then maintain high-linearity of an communication system without distorting RF output signal.

In at least one of the embodiments of the instant disclosure, the RF power amplifier of the instant disclosure is further able to achieve over-voltage protecting, so as to avoid damage of the electronic system from over-high battery voltage.

The descriptions illustrated supra set forth simply the preferred embodiments of the instant disclosure, however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A RF power amplifier, used for receiving and amplifying a RF input signal and accordingly outputting a RF output signal, the RF power amplifier comprising:
    a bias circuit, electrically connected to a first system voltage, the bias circuit providing a bias current, wherein when the first system voltage is larger than a first voltage threshold value, the bias circuit receives a first current rising slightly;
    a output-stage circuit, electrically connected to a second system voltage and the bias circuit, the output-stage circuit receiving the bias current for working at an operation bias point; and
    a RF compensation circuit, electrically connected to the bias circuit, wherein when first system voltage is larger than a second voltage threshold value, the RF compensation circuit receives a second current rising slightly transmitted from the bias circuit, wherein the second voltage threshold value is larger than the first voltage threshold value and when the first system voltage works in an operation voltage interval, current value of the first current is larger than current value of the second current and slope of rising slightly is identical to each other substantially, so that a quiescent operating current of the RF power amplifier is independent of change of the first system voltage,
    wherein when the first system voltage is larger than a third voltage threshold value, current value of the first current is equal to current value of the second current, so that the bias current is zero current for over-voltage protecting RF power amplifier, wherein the third voltage threshold value is larger than the second voltage threshold value,
    wherein when the first system voltage works in the operation voltage interval, current values of the first current and the second current increase with increasing of the ambient temperature, and rising magnitude is identical to each other substantially, so that the quiescent operating current is a current equal to or close to zero temperature coefficient.

2. The RF power amplifier according to claim 1, wherein first voltage threshold value is between 2.3 volt and 2.5 volt, the second voltage threshold value is between 2.9 volt and 3 volt, the third voltage threshold value is between 5.8 volt and 6 volt, and the operation voltage interval is between 3.2 volt and 4.2 volt.

3. The RF power amplifier according to claim 1, further comprising:
    an input match circuit, electrically connected to the output-stage circuit, the input match circuit receiving the RF input signal and then providing performance of matching input power to the output-stage circuit; and
    an output match circuit, electrically connected to the output-stage circuit, the output match circuit outputting the RF output signal and then providing performance of matching output power to the output-stage circuit.

4. The RF power amplifier according to claim 3, the bias circuit further comprising:
    a first resistor, having one terminal connected to the first system voltage;
    a first transistor, having a base connected to another terminal of the first resistor, having a collector connected to the first system voltage;
    a second transistor, having a collector connected to the base of the first transistor, having an emitter connected to a ground voltage;
    a second resistor, having one terminal connected to an emitter of the first transistor, having another terminal connected to the base of the second transistor; and
    a third resistor, having one terminal connected to the emitter of the first transistor.

5. The RF power amplifier according to claim 4, wherein the output-stage circuit comprising:
    an output transistor, having a base connected to another terminal of the third resistor, having an emitter connected to the ground voltage; and
    a collector resistor, having one terminal connected to the second system voltage, having another terminal connected to collector of the output transistor,
    wherein the output transistor receives and amplifies the RF input signal via the input match circuit, and outputs the RF output signal via the output match circuit,
    wherein when emitter area of the output transistor is N times of emitter area of the second transistor and resistor value of the second resistor is N times of resistor value of the third resistor, the quiescent operating current of the output transistor is N times of the third current, wherein N is rational number larger than 1.

6. The RF power amplifier according to claim 5, the RF compensation circuit comprising:
  a fourth resistor, having one terminal connected to the ground voltage;
  a fifth resistor, having one terminal connected to the ground voltage;
  a sixth resistor, having one terminal connected to the ground voltage;
  a third transistor, having an emitter connected to another terminal of the fourth resistor, having a base connected to another terminal of the fifth resistor;
  a fourth transistor, having an emitter connected to another terminal of the sixth resistor, having a base connected to the base of the third transistor;
  a seventh resistor, having one terminal connected to another terminal of the fifth resistor, wherein resistor value of the fifth resistor is three times of resistor value of the seventh resistor and resistor value of the fourth resistor and the sixth resistor is less than resistor value of the seventh resistor;
  a fifth transistor, having an emitter connected to a collector of the fourth transistor, having a collector connected to another terminal of the first resistor for receiving the second current;
  a sixth transistor, having an emitter connected to another terminal of the seventh resistor, having a base connected to a base of the fifth transistor and a collector of the third transistor, having a collector connected to the first system voltage; and
  a eighth resistor, having one terminal connected to the collector of the third transistor, having another terminal connected to the first system voltage,
  wherein through adjusting ratio of resistor value between the eighth resistor and the first resistor so that the quiescent operating current is a current equal to or close to zero temperature coefficient.

7. The RF power amplifier according to claim 6, wherein when first system voltage is larger than third voltage threshold value, the fifth transistor and the sixth transistor significantly draw all of the first current to be served as the second current, so that the bias current is zero current.

8. The RF power amplifier according to claim 7, wherein when resistor value of the eighth resistor is three times of resistor value of the first resistor and the first system voltage works in the operation voltage interval, current value of the first current is larger than current value of the second current and slope of rising slightly is identical to each other, so that the quiescent operating current is independent of change of the first system voltage.

9. The RF power amplifier according to claim 6, wherein the first transistor, the second transistor, the third transistor, the fourth transistor, the fifth transistor, the sixth transistor and the output transistor are hetero-junction bipolar transistors (HBT).

10. An electronic system, comprising:
  a RF power amplifier according to claim 1, the RF power amplifier receiving a RF input signal and outputting a RF output signal; and
  a load, electrically connected to the RF power amplifier, the load receiving the RF output signal.

\* \* \* \* \*